United States Patent [19]

Borkar

[11] Patent Number: 4,975,598
[45] Date of Patent: Dec. 4, 1990

[54] TEMPERATURE, VOLTAGE, AND PROCESS COMPENSATED OUTPUT DRIVER

[75] Inventor: Shekhar Borkar, Portland, Oreg.

[73] Assignee: Intel Corporation, Santa Clara, Calif.

[21] Appl. No.: 287,915

[22] Filed: Dec. 21, 1988

[51] Int. Cl.⁵ ............................................. H03K 17/16
[52] U.S. Cl. ..................................... 307/443; 307/310; 307/451
[58] Field of Search ............... 307/443, 448, 451, 452, 307/453, 542, 568, 310, 362, 584, 585

[56] References Cited

U.S. PATENT DOCUMENTS

| | | | |
|---|---|---|---|
| 4,473,762 | 9/1984 | Iwahashi et al. | 307/594 |
| 4,584,492 | 4/1986 | Sharp | 307/475 |
| 4,638,187 | 1/1987 | Boler et al. | 307/451 |
| 4,691,127 | 9/1987 | Huizer | 307/475 |
| 4,749,882 | 6/1988 | Morgan | 307/451 |
| 4,760,292 | 7/1988 | Bach | 307/475 |
| 4,777,389 | 8/1988 | Wu et al. | 307/451 |
| 4,785,203 | 11/1988 | Nakamura | 307/451 |
| 4,820,942 | 4/1989 | Chan | 307/443 |
| 4,829,199 | 5/1989 | Prater | 307/443 |
| 4,855,623 | 8/1989 | Flaherty | 307/451 |
| 4,857,770 | 8/1989 | Partovi et al. | 307/451 |
| 4,866,308 | 9/1989 | Cecchi et al. | 307/451 |
| 4,877,980 | 10/1989 | Kubinec | 307/585 |
| 4,880,997 | 11/1989 | Steele | 307/451 |

Primary Examiner—Stanley D. Miller
Assistant Examiner—T. Cunningham
Attorney, Agent, or Firm—Blakeley, Sokoloff, Taylor & Zafman

[57] ABSTRACT

An output driver for high performance integrated circuits. The driver dynamically compensates for variations in temperature, voltage and process. To perform the compensation, the driver is divided into two parts: static and transient. The static part is used to maintain the DC level. The transient part is active only during logic 0 to 1 and 1 to 0 transitions and is used only to assist the static part during such transitions. A closed loop feedback technique is used to compensate the driver for temperature, process, and voltage variations; specifically, a scaled down version of an output driver is used to monitor speed variations due to temperature, process, and voltage, the output of which is fed back to the output driver which then performs the necessary compensation.

13 Claims, 10 Drawing Sheets

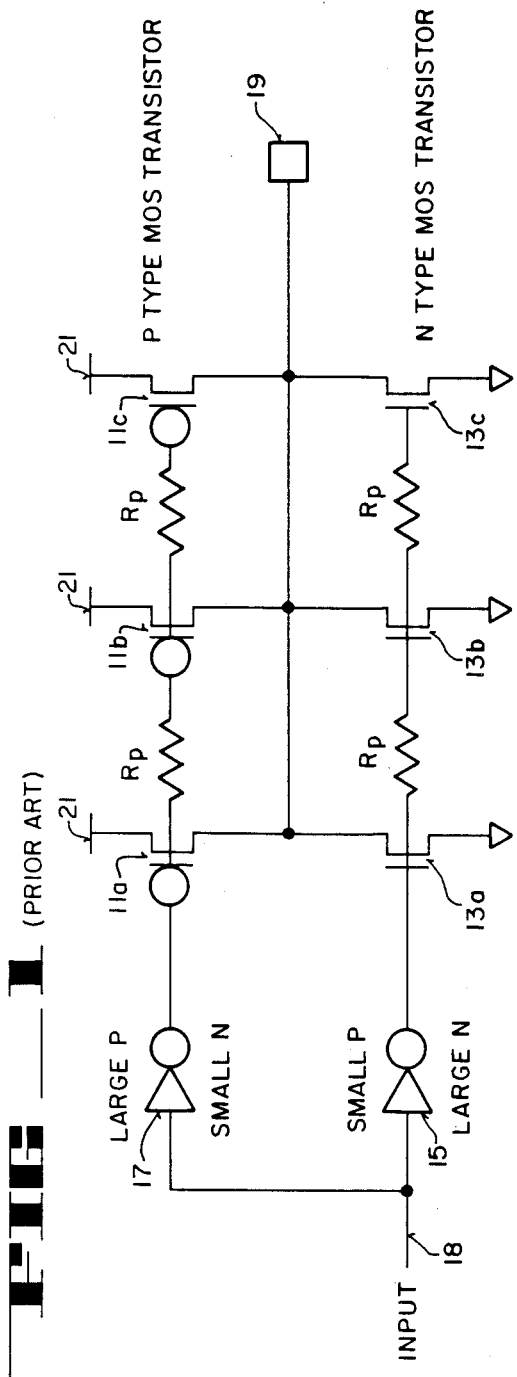
FIG.—1 (PRIOR ART)
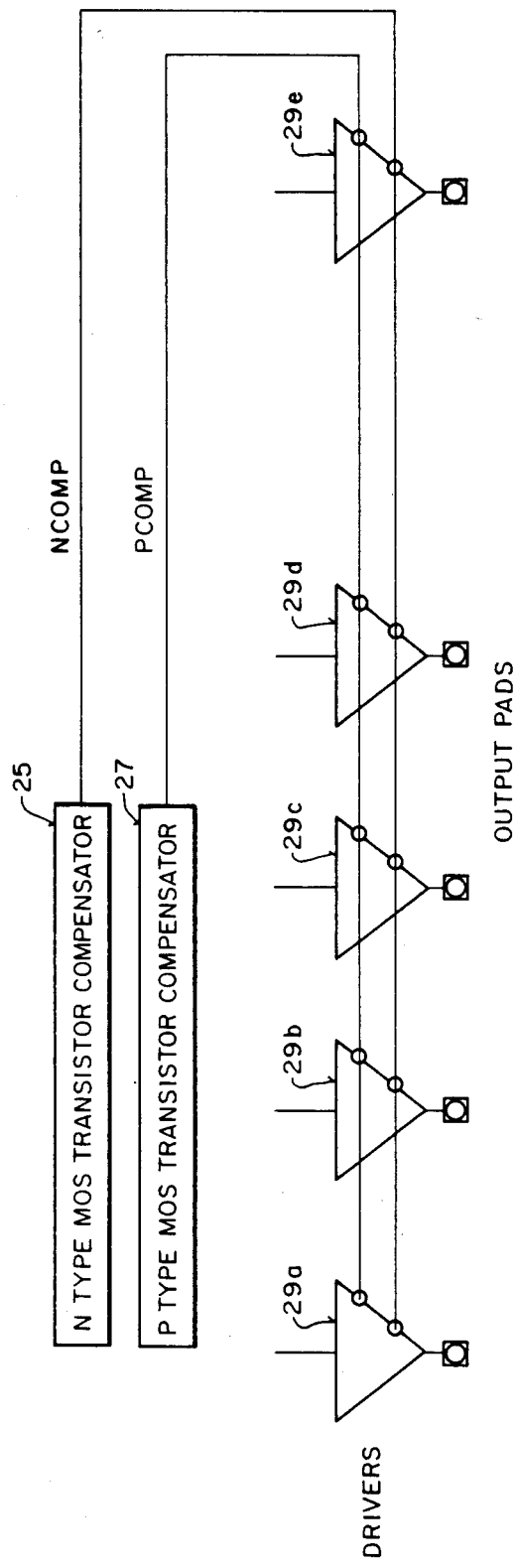
FIG.—2

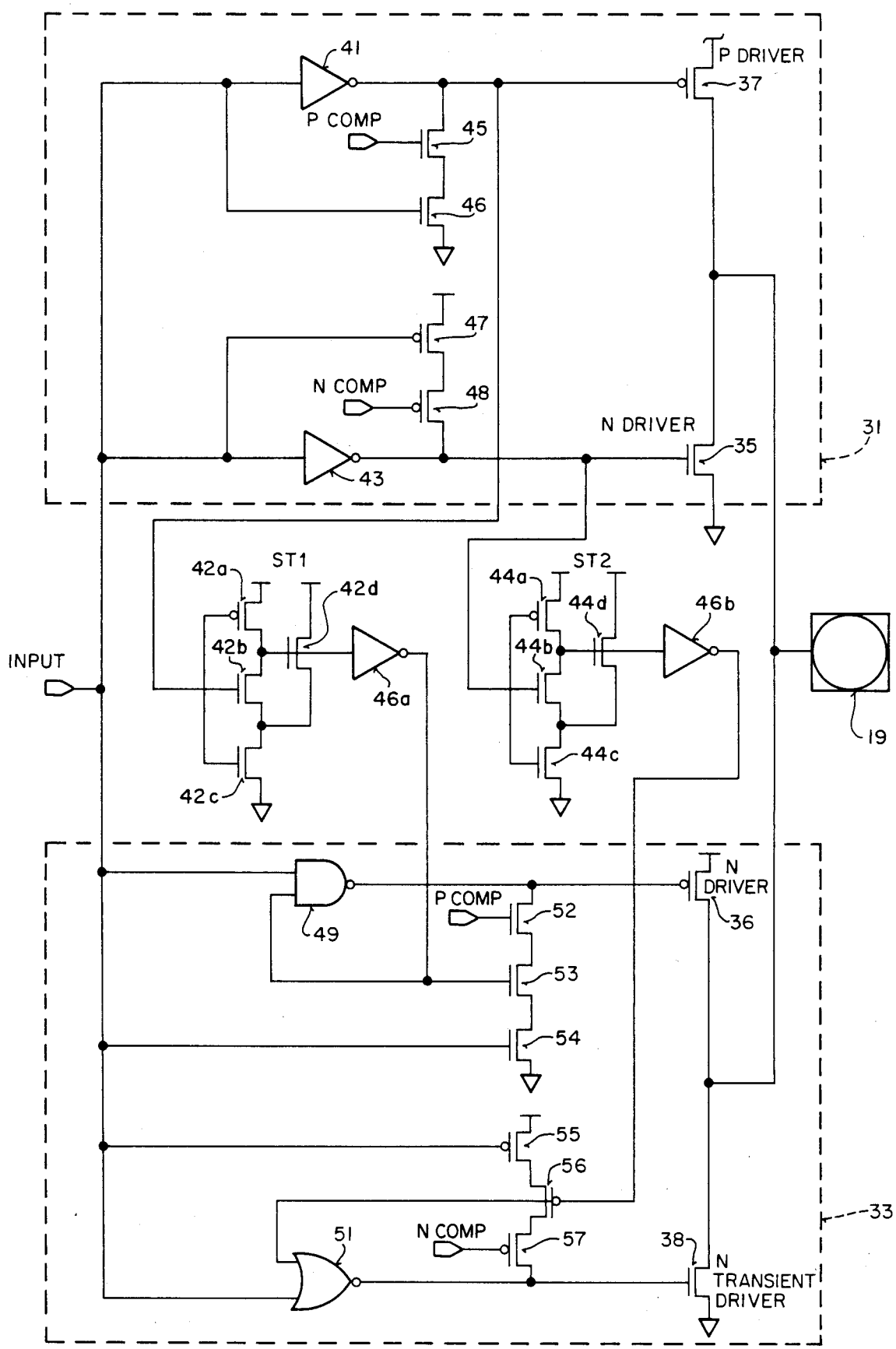

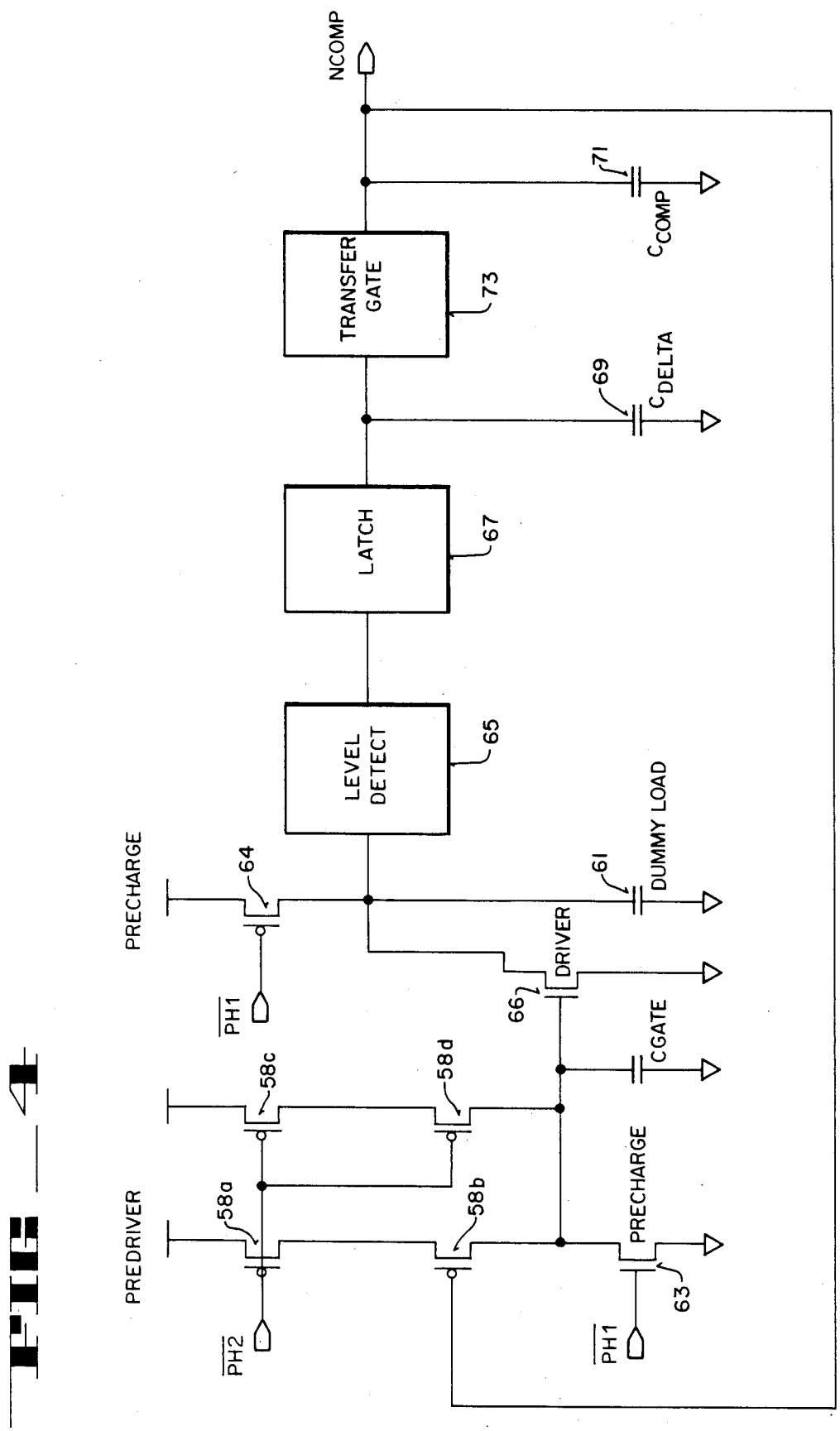
FIG._4

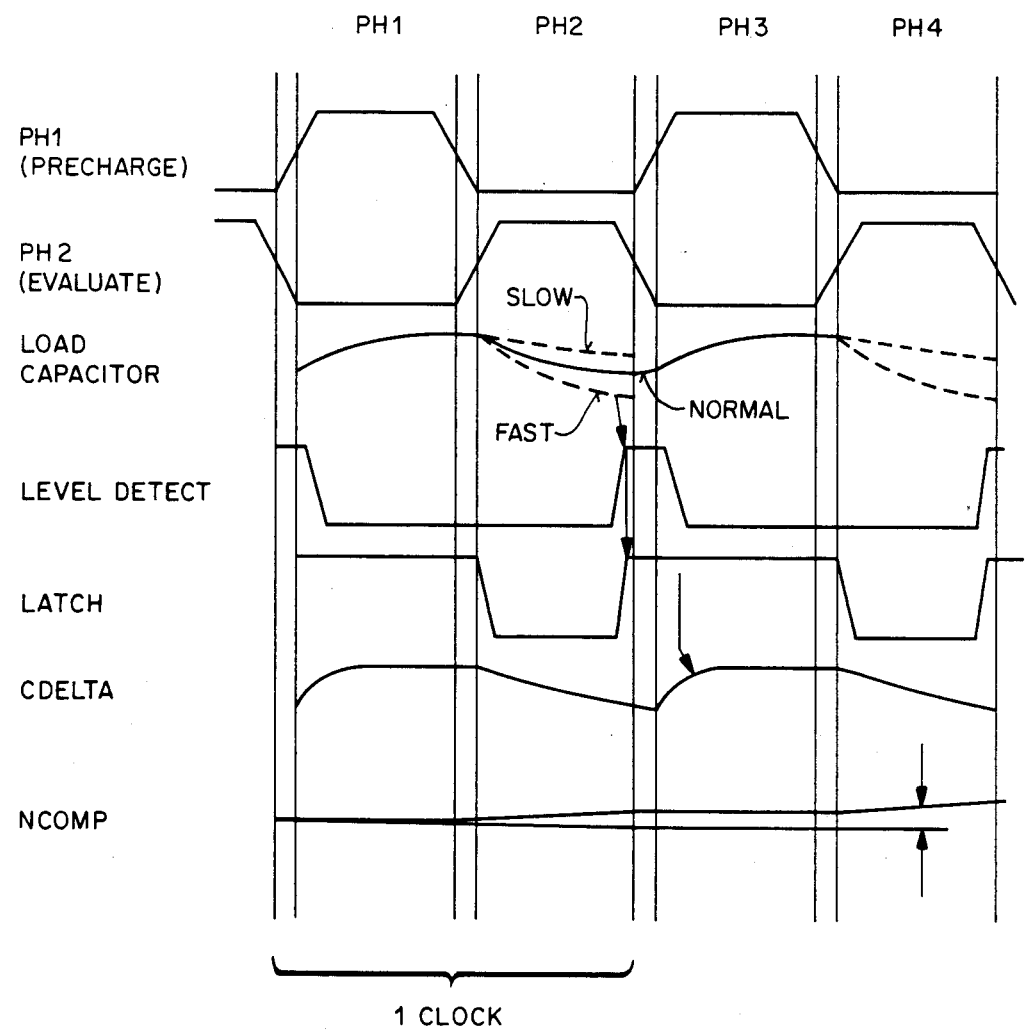
FIG_5

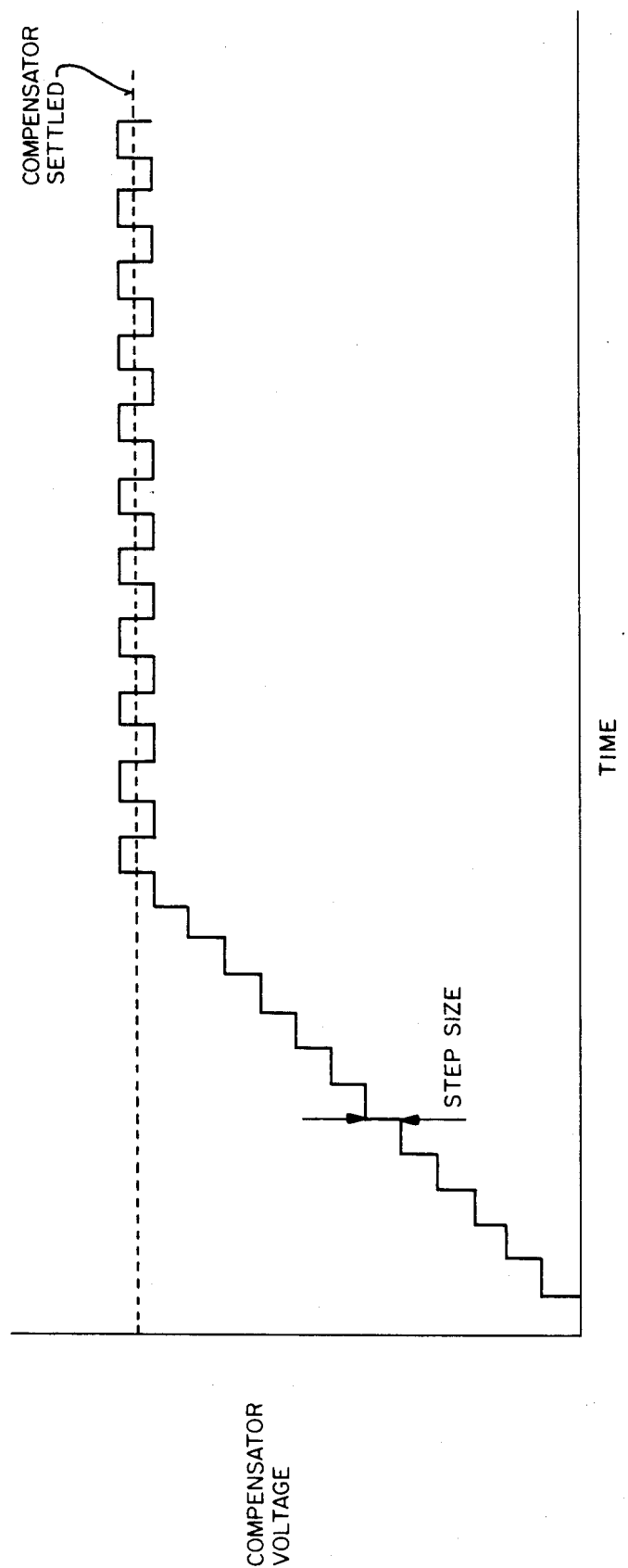

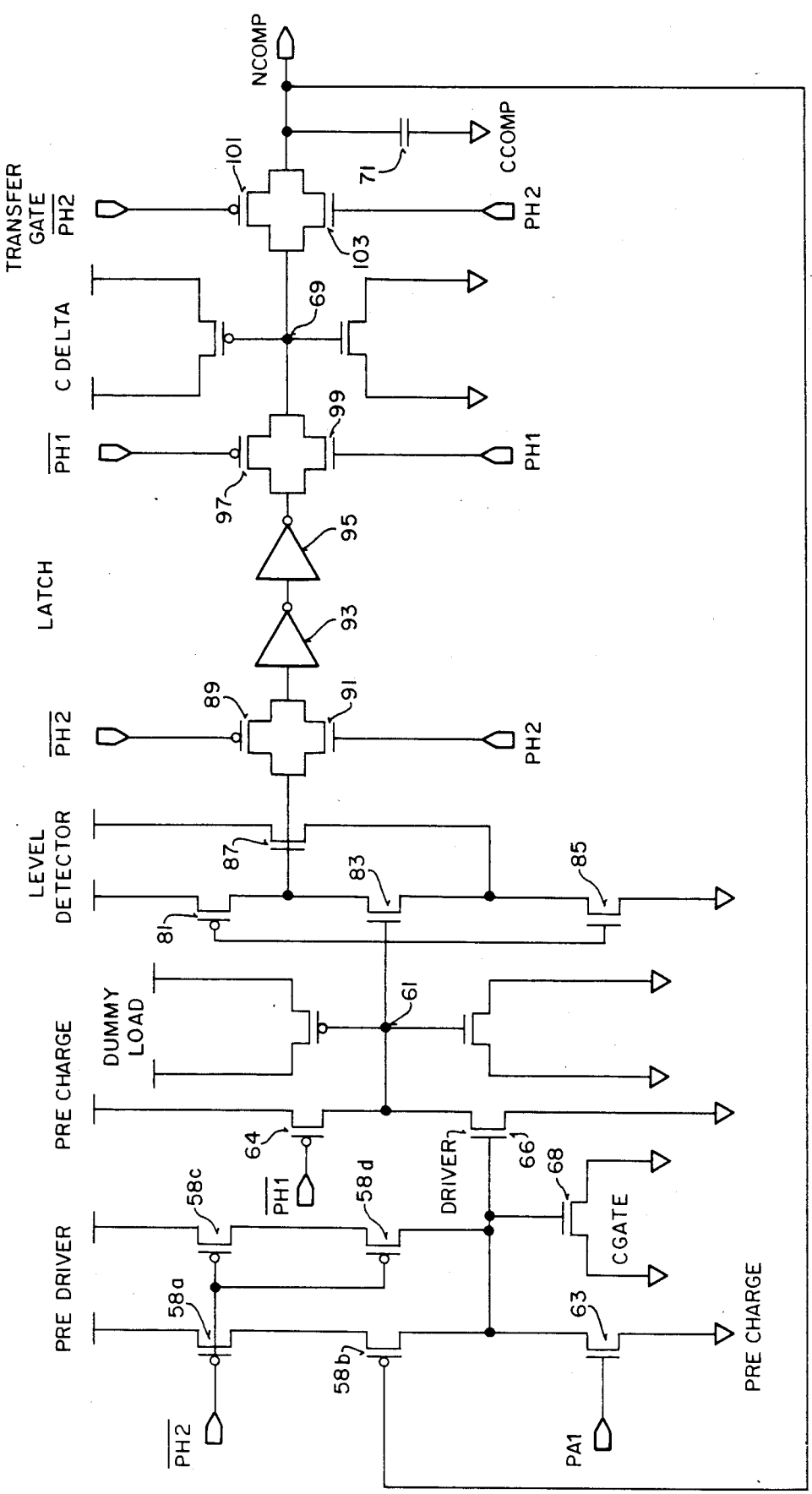
FIG.—7

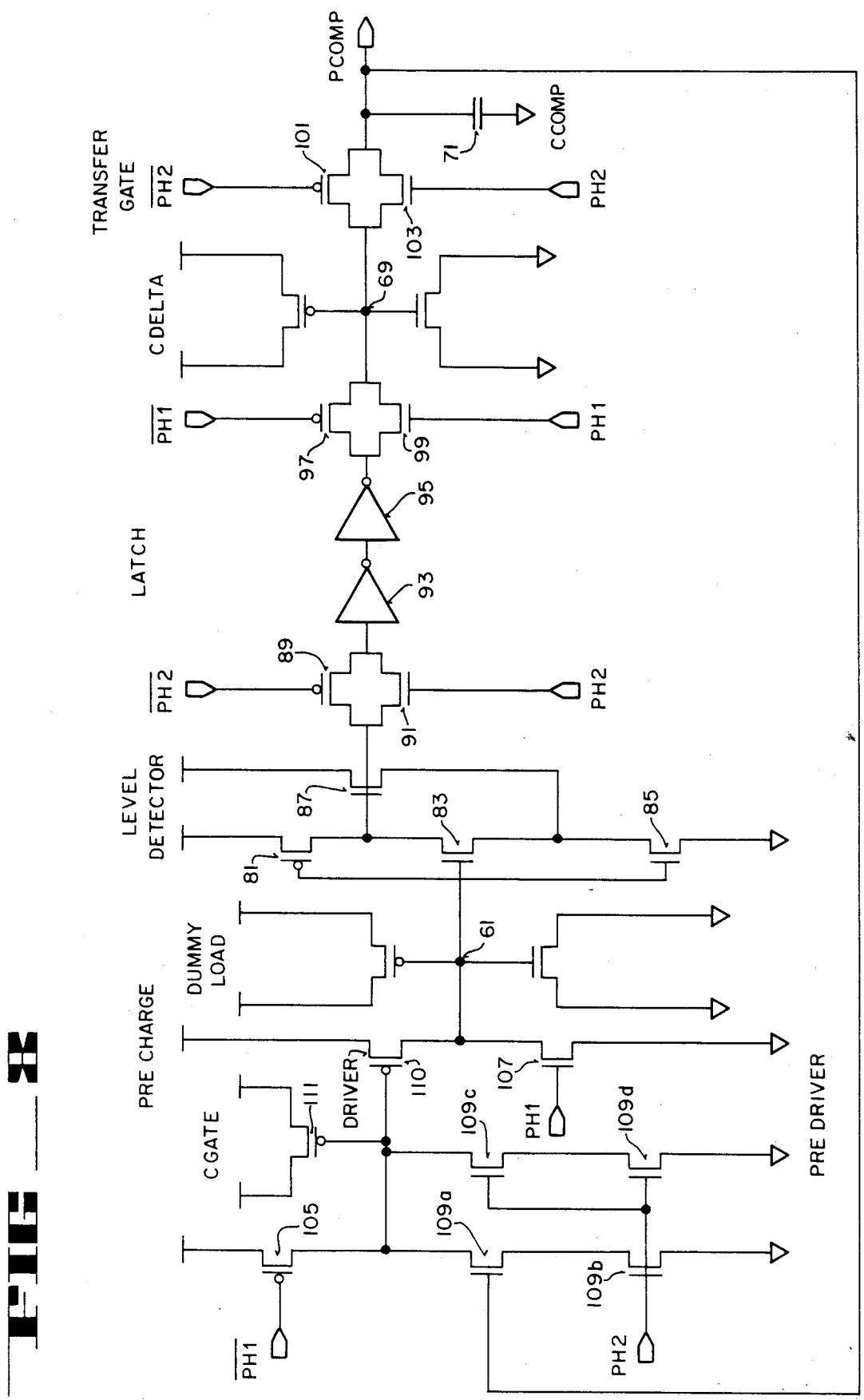

FIG_9
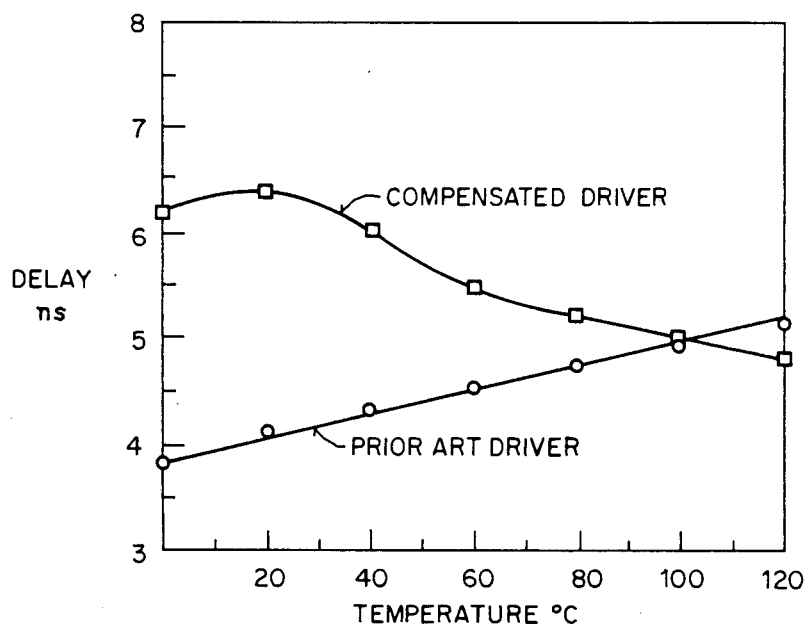
DELAY AS A FUNCTION OF TEMPERATURE
FIG_10
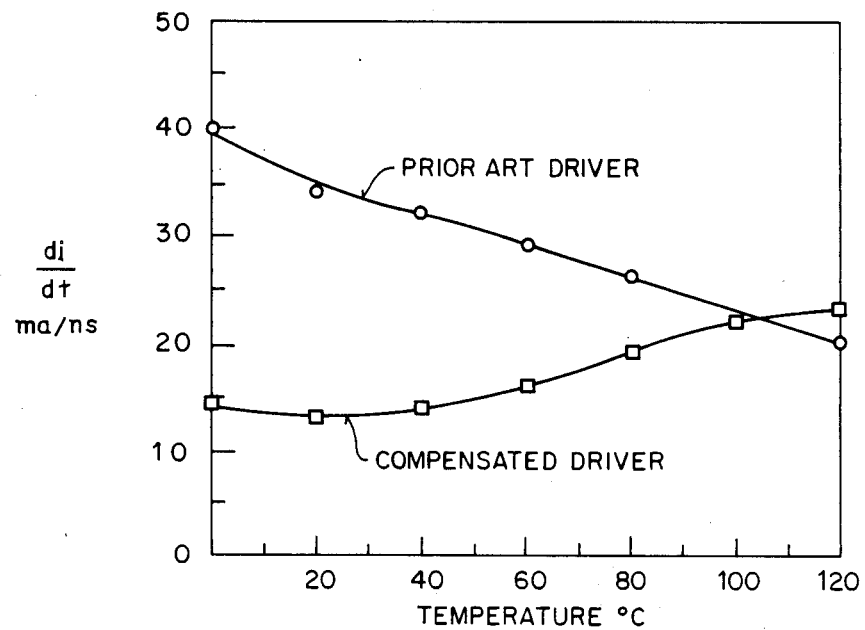
(di/dt) AS A FUNCTION OF TEMPERATURE

DELAY AS A FUNCTION OF POWER SUPPLY VOLTAGE (di/dt) AS A FUNCTION OF POWER SUPPLY VOLTAGE

FIG_13
DELAY AS A FUNCTION OF PROCESS SHIFTS
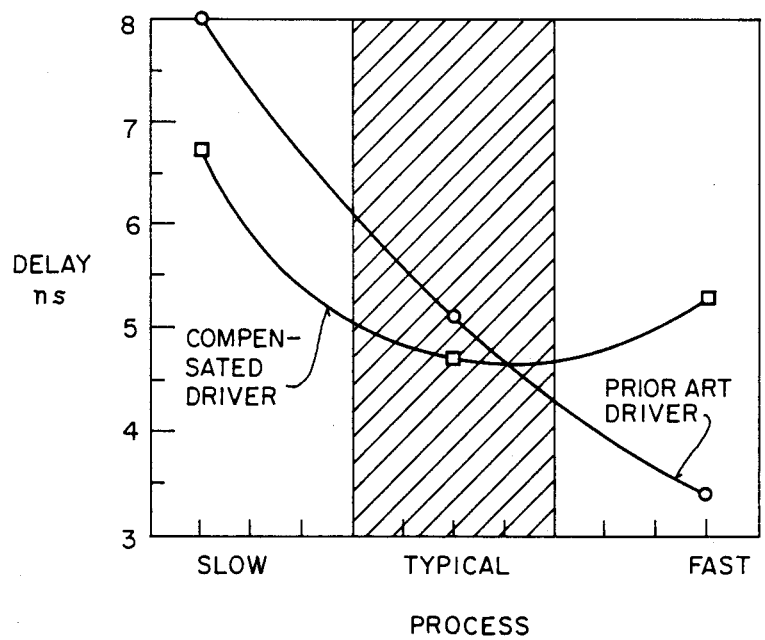
FIG_14
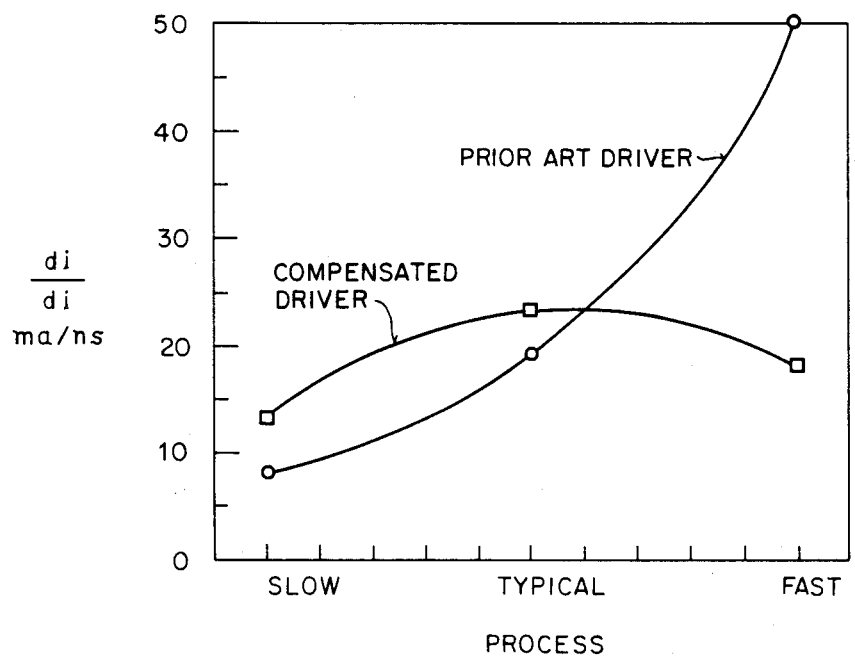

TEMPERATURE, VOLTAGE, AND PROCESS COMPENSATED OUTPUT DRIVER

FIELD OF THE INVENTION

The present invention relates to large scale integrated circuits and specifically, implementations of output drivers in such circuits.

BACKGROUND OF THE INVENTION

Output drivers, which are also called output buffers, of large scale integrated circuits ("chips")- when they switch-generate noise in the chip's power supply lines. As the performance of the output driver changes with temperature, process, and voltage, so does the noise. For a good design, the noise should be restricted to levels set by the circuit designer based upon the characteristics of the particular chips used in the design. This requires that the output driver have a steady performance. The present invention is directed to a new output driver design which is compensated to give steady performance for changes in temperature, process, and power supply voltage.

PRIOR ART DRIVER

A typical prior art output driver is shown in FIG. 1. The driver comprises a large P type transistor (PMOS), and a large N type transistor (NMOS). These large transistors are capable of driving a large external load. The transistors are broken down into multiple small transistors in parallel. FIG. 1 shows them as broken down into groups of three each, transistors 11a-11c (PMOS) and 13a-13c (NMOS). The gates of the transistors, however, are connected in series using resistors Rp. These resistors are formed by polysilicon interconnection layers. Usually such resistance is not desirable in chip circuitry, and chip designers tend to use designs which avoid this resistance. However, in the case of output drivers, the resistance is used at an advantage. The two driver transistors are each connected to an inverter 15 and 17, called pre-drivers. An internal input 18 generated by the chip drives the pre-drivers, the pre-drivers drive the drivers, and the drivers drive the external load by placing a signal on its corresponding pin or pad 19.

The pre-driver 17 of the P type driver has large P transistor, and a small N transistor in it. Similarly, the N transistor pre-driver 15 has a small P and large N transistor. When the input signal 18 makes a logic 0 to a logic 1 transition, the output of the driver makes a similar transition. However, the following chain of events take place in between. Assume the input to the pre-drivers 17 and 15 is a logic 1, so their P transistors are turned off, and their N transistors are turned on. The N transistor of the N pre-driver is larger than the N transistor of the P pre-driver, so the N driver's gate is discharged to 0 volts faster than the P transistor's gate. This ensures that the N driver is turned off faster. Now, since the P driver's gate is also being discharged (although more slowly), it starts conducting, and pulls the output node 19 to the power supply voltage 21, or logic 1. The resistors Rp delay switching of individual transistors of the driver, due to RC delay; where R is the resistance of the polysilicon interconnect, and C is the gate capacitance. Thus, the individual transistors 11a-11c and 13a-13c are gradually turned on/off. This reduces current spikes in the power supply, and subsequently reduces noise. Similarly, for a logic 1 to 0 transition, the N driver is active, and similar events take place.

PERFORMANCE OF THE PRIOR ART DRIVER

Prior art output drivers are found to be adequate for most designs, and are an established and well understood way of designing an output driver. However, as higher performing chips are developed, the performance of prior art output drivers is severely limiting. For example, with new VLSI processes capable of high performance, it is necessary to reduce the resistances between the transistors of the output drivers. However, reducing such resistances results in higher noise. For a typical 50 pf driver, the results are tabulated in Table I.

TABLE I

| Temperature degrees C. | Supply Voltage volts | Lo to Hi delay nano-seconds | Hi to Lo delay nano-seconds | di/dt Power ma/ns | di/dt Ground ma/ns |
|---|---|---|---|---|---|
| 0 | 5.0 | 3.8 | 3.9 | 38 | 42 |
| 120 | 4.0 | 6.2 | 6.1 | 10 | 11 |

The results in Table I take into consideration changes in temperature, and supply voltage, but do not reflect changes in process. However, even without considering process variation, the delay changes from about 6 nano-seconds to about 4 nano-seconds when the temperature changes from 120° to 0° Celcius. If the driver is designed for the worst case of 120° C., then the design would have been acceptable since drivers speed up at low temperatures and thus have improved performance. However, the noise on the power supply lines also increase as the drivers speed up. Specifically, as shown in Table I, the rate of change of current (di/dt) also increases as the drivers speed up. This (di/dt) causes a voltage drop across the bond-wires and pins which supply power due to the inductance of the bond-wires and pins. This voltage drop appears as noise on the signal and is given by:

$$V_{noise} = L \frac{di}{dt}$$

where L is the total inductance in the path. Typically more than one output driver is connected to a bond-wire and pin. Thus the noise voltage is multiplied by the number of drivers connected. For example, ten drivers would give 10*3*10=300 millivolts of noise at 120° C. (Inductance is about 3 nano-henries). The same design would give 1200 millivolts of noise at 0° C. Inasmuch as the TTL output level for logic low is 800 millivolts, a chip which works at 120° C. would fail to work with TTL logic at 0° C. Such a drastic change in noise is not acceptable for high performance chips.

A paper describing an on-chip process dependent control voltage source which regulates the charge/discharge rate of a series transistor in an output buffer is Gabara, Thompson "Ground Bounce Control In CMOS Integrated Circuits," ISSCC, Feb. 17, 1988, digest pages 88–89. In particular, FIG. 1(b) illustrates a voltage controlled tri-stateable output buffer.

SUMMARY OF THE INVENTION

An output driver is an interface circuit which outputs a chip's internal digital signal to the external world via a pin or pinout. Since it drives the output pin of a chip, it is called an output driver. The internal circuitry of the chip offers a small capacitance as a load, compared to the capacitance offered by board traces and system interconnect wires. Thus, the drivers internal to a chip are relatively small, and easy to build. An output driver, on the other hand, must translate an internally generated signal (which has low drive capability) into an external signal, with high drive capability. Such a driver is usually large, performance critical, power hungry, noisy, and relatively difficult to build.

Output drivers are performance critical in that the internal signals must be output in a short time interval. Otherwise the overall performance of the chip is reduced. Also, they should be able to drive adequate loads. For example, an address driver capable of driving a 50 pf (Pico-farads) load can be used with only five memory chips, if the inputs of the memory chips offer a 10 pf load. To add more memory chips, another buffer chip to buffer the address which can drive more than five memories is needed. This adds extra delay in the signal propagation, increases system power consumption, requires extra board space, and thus limits the chip's usefulness.

Output drivers generate noise in the internal power supply rails of the chip. The noise is introduced as the output drivers switch concurrently from one logic state to the other. This surge of current in the power pins alleviate the supply voltage on the chip due to the inductance of the pins and the bond wires which connect package pins to the internal silicon chip. This sharp voltage surge in the power supply rails of the chip results in a noise glitch on the signal pin, a problem which will be even worse in future chips as their complexity grows, processes become faster, clock rates increase, and the number of drivers increase.

To complicate matters further, performance of output drivers change with temperature, process, and supply voltage. In particular, as the temperature increases, the transistors within the chip operate slower, causing the drivers to be slower. Noise, on the other hand, is high at low temperatures, since the drivers are stronger and can therefore switch a lot of current. Process shifts (during fabrication) and power supply shifts have similar effects on performance of the drivers. When the process is faster, or the voltage is higher, the drivers are faster, and the noise is higher. Similarly, slower process and lower voltages make drivers slower and less noisy.

It is not always possible to design the drivers for the worst case. For example, if a driver is designed for the worst case noise; i.e. for the fastest process, highest voltage, and the lowest temperature, then its speed is going to degrade at higher temperatures. Similarly, if a chip is designed for the worst case speed, then the noise is going to increase at lower temperatures. Traditional drivers suffer from these variations. This invention is directed to a new technique in output driver design which compensates for temperature, voltage and process variations. The invented circuit tracks chip temperature, and supply voltage. When the chip is powered up, the temperature is low, so it slows down the drivers. As the temperature of the chip rises, the subject invention compensates by speeding up the output drivers.

The invented driver design incorporates the following new features to perform the above-described compensation:

(i) the driver is divided into two parts: static and transient. The static part, which is similar to a prior art driver, is used to maintain the DC level. The transient part is active only during logic 0 to 1 and 1 to 0 transitions and is used only to assist the static part.

(ii) a closed loop feedback technique is used to compensate output drivers for temperature, process, and voltage variations.

(iii) a scaled down version of an output driver is used to monitor speed variations due to temperature, process, and voltage, the output of which is fed back to the output driver which then performs the necessary compensation.

BRIEF DESCRIPTION OF THE FIGURES

FIG. 1 is a schematic representation of a prior art output driver.

FIG. 2 is a block diagram illustrating the compensation scheme of the present invention.

FIG. 3 is a schematic representation of a single output driver according to the present invention.

FIG. 4 is a block diagram illustrating a compensation circuit for an N driver transistor compensation circuit.

FIG. 5 is a timing diagram showing voltage waveforms in an N driver compensator.

FIG. 6 is a graphical representation showing compensation voltage buildup over time according to the present invention.

FIG. 7 is a detailed schematic diagram illustrating a compensation circuit for an N driver transistor compensation circuit.

FIG. 8 is a detailed schematic diagram illustrating a compensation circuit for a P driver transistor compensation circuit.

FIG. 9 is a graph comparing delay as a function of temperature for a compensated driver and a prior art driver.

FIG. 10 is a graph comparing (di/dt) as a function of temperature for a compensated driver and a prior art driver.

FIG. 13 is a graph comparing delay as a function of process shifts for a compensated driver and a prior art driver.

FIG. 14 is a graph comparing (di/dt) as a function of process shifts for a compensated driver and a prior art driver.

DETAILED DESCRIPTION OF THE INVENTION

Figure 11:
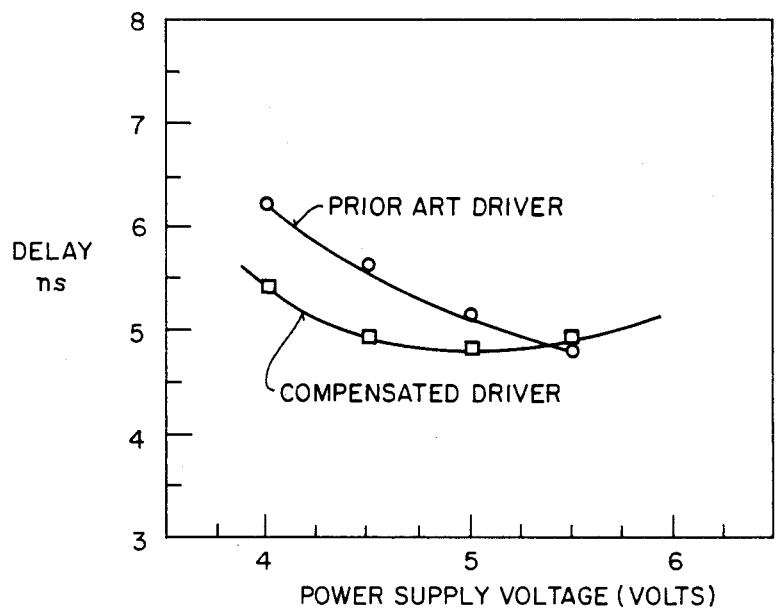
FIG. 11 is a graph comparing delay as a function of power supply voltage for a compensated driver and a prior art driver.

In view of the above described problems, output drivers in high performance chips need a compensation circuit to maintain steady performance and noise level. FIG. 2 shows the concept behind the compensation scheme of the present invention.

The compensator comprises two circuit blocks, one for N transistors 25, and the other for P transistors 27. The invented compensator takes into consideration the overall circuit for the specific driver transistor. For example, the N transistor in the driver is responsible for logic 1 to logic 0 transitions. This N transistor is driven by a P transistor of the pre-driver. Thus, the speed could increase because 1) the N transistor is faster or 2) the P transistor is faster. The important point to keep in mind is that the overall effect is due to behavior of both transistors, and not one. Their relative contribution depends on their sizes.

The compensator blocks 25 and 27 shown in FIG. 2 track overall performance of the transistors, and produce two analog signals NCOMP and PCOMP. The signals NCOMP and PCOMP vary between 0 volts and 5 volts (supply) and control the speed of the output drivers 29a–29e. Since the compensators 25 and 27 and the output drivers 29a–29e reside on the same silicon die, they track each other. The importance of this fact is that both are subject to the same thermal effects, the same process variations, and the same supply voltage.

Compensated Output Driver

The invented output driver, corresponding to one of elements 29a–29e of FIG. 2, is shown in FIG. 3. The driver is divided into two parts: static 31, and transient 33. The static part is always active and comprises an N driver 35, a P driver 37 and predrivers 41 and 43; it maintains the voltage level at the output. If the output is logic 0, then the N driver 35 of the static part conducts, and provides current to maintain this level. When the output switches from logic 0 to logic 1, then the N driver 35 is turned off and the P driver 37 turns on. If the output is connected to a DC load, then the static driver transistors 35 and 37 source current to maintain the logic level. Since this part of the driver is always active, it is called static.

The transient part 33 is active only when the output makes a transition from one logic state to another; hence the name "transient". Output drivers switch a lot of current during a logic swing, and the transient part assists the static part. In this manner, maximum drive is obtained from both the parts when needed, so that the transient part can be gradually turned off. This controlled turn-off of the transient part helps reduce the rate of change of current (di/dt), and thus reduces the noise. Once the logic state is reached, the transient part is completely turned off, and the static part is strong enough to maintain the logic level.

As noted above, the static part comprises two driver transistors 35 and 37; and two pre-drivers (inverters) 41 and 43. This circuit is very much like the prior art driver, except for the compensation transistors 45–48 across the pre-drivers. These transistors assist the pre-drivers when the process is slower, or the temperature increases. The compensating transistors 45 and 46 are connected across the N transistor of the pre-driver 41. Similarly, the compensating transistors 47 and 48 are connected across the P transistor of pre-driver 43. The following discussion explains the role of these assist transistors in the operation of the invented driver.

Consider the N driver transistor 35. This transistor is turned on to switch output from logic 1 to logic 0. This is done by charging its gate to logic 1 (supply), then it conducts and discharges external load to 0 volts. Charging of the gate is accomplished by a P transistor in its pre-driver 43. If the driver transistor becomes slow, then one of the ways of compensating for this is to charge its gate faster. On the other hand, if the P transistor in the pre-driver 43 is slow, then the P transistor needs some assistance. To charge the N driver 35 gate faster, the P transistor in the pre-driver should be made stronger. The two P transistors 47 and 48 are in parallel with the P transistor of pre-driver 43. The signal NCOMP (which is generated by the compensator) determines the strength of transistor 48, and thus the strength of the assist path. To make it faster, the NCOMP signal voltage is lowered, and to make it slower the NCOMP signal voltage is made higher. The NCOMP signal controls the P transistor which conducts when gate voltage is lower than the source. By controlling the signal NCOMP, the driver is made to operate faster or slower for a logic 1 to 0 transition. Similarly, the transistors 45 and 46 along with the compensating signal PCOMP control the speed of logic 0 to 1 transitions.

With the help of the two compensation signals NCOMP and PCOMP, the speed of the drivers can be kept constant. If for whatever reason (temperature, process, or voltage) a logic 1 to 0 transition has to be made faster, then the signal NCOMP voltage is made lower. Similarly for a logic 0 to 1 transition improvement, the signal PCOMP voltage is made higher.

The transient part 33 is similar to the static part except, as mentioned above, it is active only during logic transitions, with transistors 36 and 38 functioning the same as transistors 37 and 35 respectively, although only during logic transitions. Unlike the prior art pre-drivers, the pre-drivers of the transient part of the subject invention are no longer simple inverters, but are replaced by NAND and NOR gates 49 and 51. Assisting these gate pre-drivers are the transistor chains 52–54 and 55–57 as in the static part. Their function is similar, to increase or decrease the strength of the pre-drivers 49 and 51. The two structures, ST1 and ST2, are level detectors. ST1 comprises transistors 42a–42c connected in serial, transistor 42d connected in parallel with transistors 42a and 42b, with the output of the transistors coupled to an inverter 46a. Similarly, ST2 comprises transistors 44a–44c connected in serial, transistor 44d connected in parallel with transistors 44a and 44b, with the output of the transistors coupled to an inverter 46b. ST1 and ST2 monitor voltage levels at the gate of the static driver transistors 37 and 35, respectively. Consider a logic 1 to 0 transition at the output 19. For that, both static and transient parts are active. During this process, the gate of transistor 35 is steadily charging towards supply voltage. When the gate reaches a predetermined trip point (trigger point) of ST2, its output swings from logic 0 to logic 1. The trip point is usually set to approximately one-half the supply voltage. However, if it is anticipated that higher than usual levels of noise will be encountered, the trip point should be set higher than one-half supply voltage in order to avoid unintended compensation due to noise. When the output of ST2 swings to logic 1, NOR gate 51 is disabled in the transient part. The N driver transistor 38 of the transient part, whose gate was also charging towards supply voltage and assisting the static part, now starts becoming inactive and its gate starts discharging. Similarly, for a logic 0 to 1 transition at output 19, the gate of transistor 37 is steadily charging towards ground voltage. When the gate reaches the predetermined trip point (trigger point) of ST1, its output swings from logic 1 to logic 0. When the output of ST1 swings to logic 0, NAND gate 49 is disabled in the transient part. The P driver transistor 36 of the transient part, whose gate was also charging towards ground voltage and assisting the static part, now starts becoming inactive and its gate starts charging towards supply voltage.

Compensator Circuit

The concept behind the compensator circuit, which generate the signals NCOMP and PCOMP, is shown in FIG. 4 which corresponds to N type MOS transistor compensator 25 of FIG. 2. It duplicates a scaled down version of a load that a driver usually drives. This dummy load is built on the chip as a gate capacitor 61, labeled "Dummy Load" in FIG. 4. To drive this load, it employs a scaled down version of the driver, and a pre-driver. This dummy driver 66 is also compensated the same way the actual driver is, by assist transistors 58a and 58b across the pre-drivers 58c and 58d. The load 61 is precharged to supply voltage in phase 1 of the chip's clock signal (Ph1) by a precharge transistor 64, and the driver 66 discharges this load in the next phase (Ph2). Monitoring the driver's performance is a sensing circuit. This sensing circuit comprises a level detect 65, a latch 67, two capacitors 69 and 71, and a transfer gate 73 as shown in FIG. 4. The following discussion details the operation.

As mentioned earlier, precharge transistor 64 is used to charge the load 61 to the supply voltage in phase 1 in order to precondition the load. In the next phase, the dummy driver 66 attempts to drive the load, that is discharge it. FIG. 5 shows these waveforms. The signal named "Load Capacitor" is the voltage waveform at the dummy load; it charges fully during precharge, and discharges to some intermediate value. The discharge is faster if the driver is fast, and slower if the driver is slow.

The monitoring sensing circuit has a level detector 65, with a predetermined trip point which is usually set to approximately one-half the supply voltage. However, if it is anticipated that higher than usual levels of noise will be encountered, the trip point should be set higher than one-half supply voltage in order to avoid unintended compensation due to noise. If the load voltage falls below the trip point, then level detector 65 output switches to logic 1; otherwise it is at logic 0. If the dummy driver 66 is fast, then the voltage does fall below this trip point, and the level detector's output switches to 1. On the other hand, if the dummy driver 66 is slow, then the load capacitor 61 does not discharge below the trip point and the level detector 65 does not trip. In essence, level detector 65 measures the speed of the dummy driver.

The output of the level detector is latched into latch 67 in phase 2, as shown in FIG. 4. This latch now contains vital information; if it is 1 then the driver is fast, and if it is 0 then the driver is slow. The latch charges the capacitor 69 $C_{delta}$ to logic 1 (supply voltage) or logic 0. In the next phase, i.e. phase 1, the charge on the capacitor $C_{delta}$ is transferred to a bigger capacitor 71 $C_{comp}$, through transfer gate 73. Since capacitor $C_{comp}$ is much larger than the capacitor $C_{delta}$, the voltage change on capacitor $C_{comp}$ is small, called step voltage. If the driver is fast, then capacitor $C_{delta}$ is charged to logic 1, which transfers the charge to capacitor $C_{comp}$ and the voltage across capacitor $C_{comp}$ is increased. This small increase in the signal NCOMP makes the dummy driver 66 slightly slower. The same signal is also connected to the real drivers on the chip, which become slightly slower. In the next cycle, once again the entire operation repeats, to compensate the dummy driver for process, temperature, and voltage. Since the compensation voltage is also fed to the real drivers, they track the dummy one. FIG. 5 shows voltage waveforms across capacitors $C_{delta}$ and $C_{comp}$ (signal NCOMP).

P type MOS transistor compensator 27 is similar to the compensator shown in FIG. 4 and the details of both will be set forth below.

FIG. 6 shows how the compensation voltage builds up, on step at a time. When the compensation voltage is near steady state, it oscillates. This is because the compensator is always settling. It is always making an error equal to the step voltage. So it keeps on compensating. But the step size being small, it has little effect on the speed of the driver. The step voltage is approximately given by $(C_{delta}/C_{comp})V_{supply}$.

The dummy driver 66 of the compensator is compensated for process shifts, temperature shifts, and voltage shifts. But the dummy driver and the actual driver are on the same chip. Both have the same process shifts, both are at the same temperature, and share the same power supply voltage. Since the compensator voltage can compensate the dummy driver, it can also compensate the actual driver by a closed loop feedback technique.

This foregoing description concentrated on N driver compensation. It described how to compensate for logic 1 to 0 transitions. The P driver compensator circuit is similar. FIGS. 7 and 8 show N and P compensation circuits in detail.

Referring first to FIG. 7, the details of an N driver transistor compensator circuit are shown. In this connection, FIG. 7 is substantially identical to FIG. 4 excepting that the implementation details of level detect 65, latch 67 and transfer gate 73 are shown. Thus, during phase 1, precharge transistors 63 and 64 are use to charge the load to the supply voltage. During phase 2, dummy driver 66 attempts to drive the load 61. The signal which is attempting to drive the load is input to a level detector (block 65 in FIG. 4) which comprises transistors 81, 83, 85 and 87 outputs a logic 1 when the load voltage falls below its trip point and says at logic 0 so long as the load voltage is above the trip point. The output of the level detector is input into a latch 67 as shown in FIG. 4 which is implemented as shown in FIG. 7 as a P transistor 89 and an N transistor 91 connected in parallel, the output of which is input into a pair of inverters 93 and 95, the output of which is input into another P transistor, N transistor pair 97 and 99. Also as shown in FIG. 7, transfer gate 73 of FIG. 4 is implemented as a P transistor 101 and an N transistor 103 connected in parallel. Capacitor 69 ($C_{delta}$) is implemented as a P and N transistor pair coupled in parallel between supply and ground which is the usual way to create a capacitance in a chip. The necessary capacitance for capacitor 71 ($C_{comp}$) is usually present in ample amounts by virtue of the parasitic capacitance of the metal lines between the compensator and the output drivers. Of course, additional capacitance can be added, if needed, by additional transistors.

FIG. 8 shows an implementation of a P type MOS transistor compensator used to generate the signal PCOMP. As will be apparent, the P driver transistor compensator circuit is identical to the N driver transistor compensator circuit of FIG. 7, excepting that the polarities of precharge transistors 105 and 107 are opposite to those of their counterparts 63 and 64 in the N driver transistor compensator circuit; pre-driver transistor 109a–109d are opposite to their counterparts 58a–58d; driver transistor 110 is opposite to that of its counterpart 66; and the polarity of gate capacitor 111 is opposite that of its counterpart 68.

Circuit Simulation

Simulations comparing a compensated driver with a prior art driver are shown in Table II. The compensated driver comprises two comparators and an output driver capable of driving 50 pf capacitance in about 5 nanoseconds. The circuits were simulated at various conditions. First, a typical process and supply voltage were used and the temperature was varied. Then, a typical process, and temperature were used and the supply voltage was varied. Finally, a typical temperature and supply voltage were used and the process was varied. To compare the results with a prior art driver, the simulated prior art driver was specified as providing the same performance under typical conditions. The results are shown in Table II.

optimized towards typical values. The prior art driver shows a linear relationship with voltage.

FIG. 13 shows driver delay as a function of process variations. The prior art driver shows wide variations with process shifts. The compensated driver, on the other hand, has restricted variations. The shaded area signifies typical process variations. FIG. 14 shows (di/dt) variations with process shifts.

I claim:

1. In a large scale integrated circuit formed by a predetermined process including at least one output driver, said circuit comprising:
   compensating means coupled to said output driver for compensating the performance of the output driver due to variations in temperature, voltage and the process, and wherein said at least one output driver includes:
   static means coupled to a driver input to said output

TABLE II

| Process | Temp °C. | Supply Voltage volts | Compensated Driver | | | | Traditional Driver | | | |
| --- | --- | --- | --- | --- | --- | --- | --- | --- | --- | --- |
| | | | tLH ns | tHL ns | (di/dt) vcc ma/ns | (di/dt) vss ma/ns | tLH ns | tHL ns | (di/dt) vcc ma/ns | (di/dt) vss ma/ns |
| typical | 0 | 5 | 6.2 | 6.3 | 14 | 14 | 3.8 | 3.9 | 38 | 42 |
| typical | 20 | 5 | 6.6 | 6.2 | 13 | 13 | 4.1 | 4.2 | 32 | 35 |
| typical | 40 | 5 | 6.4 | 5.6 | 13 | 16 | 4.3 | 4.4 | 32 | 32 |
| typical | 60 | 5 | 5.7 | 5.4 | 16 | 15 | 4.5 | 4.6 | 27 | 32 |
| typical | 80 | 5 | 5.2 | 5.2 | 19 | 19 | 4.7 | 4.8 | 25 | 27 |
| typical | 100 | 5 | 5.0 | 5.0 | 22 | 22 | 4.9 | 5.0 | 22 | 22 |
| typical | 120 | 5 | 4.7 | 4.9 | 24 | 22 | 5.1 | 5.2 | 19 | 20 |
| typical | 120 | 4 | 5.4 | 5.4 | 18 | 14 | 6.2 | 6.1 | 10 | 11 |
| typical | 120 | 4.5 | 4.8 | 5.0 | 20 | 20 | 5.6 | 5.6 | 15 | 15 |
| typical | 120 | 5.5 | 4.9 | 5.0 | 24 | 22 | 4.8 | 4.8 | 24 | 25 |
| slow | 120 | 5 | 6.7 | 6.1 | 14 | 12 | 8.0 | 6.8 | 8 | 9 |
| fast | 120 | 5 | 5.3 | 5.3 | 17 | 19 | 3.4 | 3.5 | 50 | 50 |

Note: Delays are measured from center of the input to the center of the output
tLH = Delay for low to high transition of the output
tHL = Delay for high to low transition of the output
(di/dt)vcc = (di/dt) on the power supply pin
(di/dt)vss = (di/dt) on the ground pin.

The results of Table II are plotted in the graphs of FIGS. 9-14. FIG. 9 shows how output driver delay changes with temperature; for both compensated and prior art drivers. At lower temperatures, the compensated driver has a higher delay which gradually decreases as the temperature increases. This means that the drivers speed up as the temperature increases. The prior art driver shows an opposite behavior. Its speed decreases—as expected—with temperature. At lower temperatures, the chip becomes faster; and other chips in the system also become faster. If the chips are faster, then they have a higher (di/dt), which ultimately results in higher noise in the system. Thus, it is desirable for the output driver to slow down at low temperatures, and the compensated driver just does that.

FIG. 10 shows how (di/dt) changes with temperature for both drivers. At lower temperatures, the compensated driver has a smaller (di/dt) than the prior art driver. As temperature increases, this (di/dt) also increases. This is desirable, since at higher temperatures it is desirable for the driver to be faster because other chips in the system become slower. Also higher (di/dt) at higher temperature does not affect noise as much as it does at lower temperatures. The prior art driver shows exactly the opposite behavior. Specifically, (di/dt) changes by a larger margin for the prior art driver.

Figure 12:
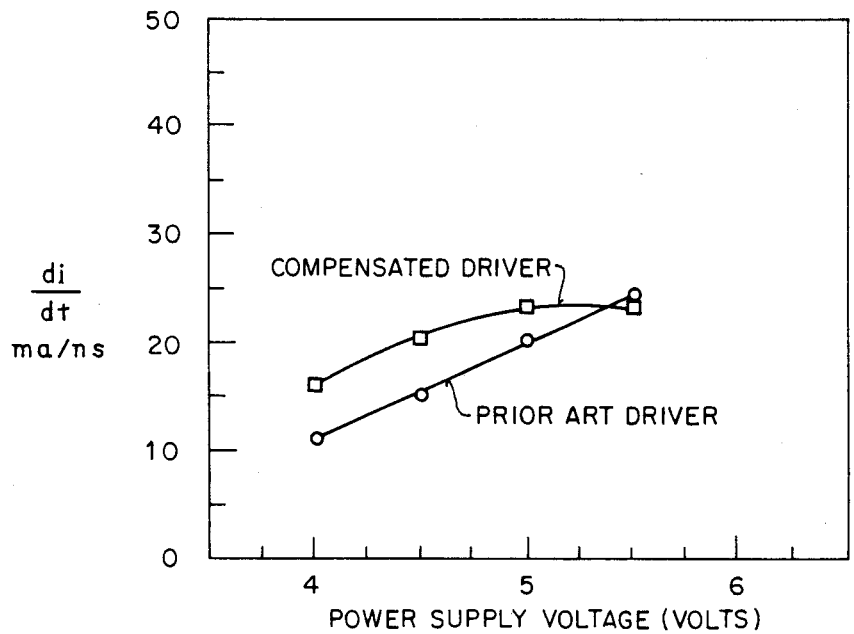
FIG. 12 is a graph comparing (di/dt) as a function of power supply voltage for a compensated driver and a prior art driver.

FIGS. 11 and 12 show how driver delay and (di/dt) vary with power supply voltage for the prior art driver and the compensated driver. The compensated driver's delay and (di/dt) vary within a limited margin, and is driver and said compensating means for generating an output of said output driver as a function of said driver input;

monitoring means coupled to said static means for monitoring said static means and generating first and second signals indicating that said output is beginning to change from a first logic level to a second logic level;

transient means coupled to said static means, said monitoring means and said compensating means operating substantially only during transitions from said first logic level to said second logic level for assisting the output of said static means to reach the second logic level and thereby reduce a rate of change of current flowing through said output driver, whereby the output of said static means is compensated due to variations in temperature, voltage and process.

2. The circuit defined by claim 1 wherein said static means comprises:
   a P transistor driver coupled to an N transistor driver;
   a first predriver having an input coupled to said driver input and having an output coupled to said P transistor driver and a second predriver having an input coupled to said driver input and having an output coupled to said N transistor driver
   a first at least one assist transistor coupled between the input and output of said first predriver controlling the switching speed of said P transistor driver;

a second at least one assist transistor coupled between the input and output of said second predriver controlling the switching speed of said N transistor driver.

3. The circuit defined by claim 2 wherein said monitoring means comprises:
   a first at least one transistor coupled to the output of said first predriver for generating said first signal for use by said transient means when said first predriver output reaches a predetermined trip point;
   a second at least one transistor coupled to the output of said second predriver for generating said second signal for use by said transient means when said second predriver output reaches a predetermined trip point.

4. The circuit defined by claim 3 wherein the predetermined trip point of each of said first and second transistors is approximately one-half of a supply voltage.

5. The circuit defined by claim 1 wherein said transient means comprises:
   a P transistor transient driver coupled to an N transistor transient driver;
   a first transient predriver having a first input coupled to said driver input and a second input for receiving said first signal and having an output coupled to said P transistor transient driver and a second transient predriver having a first input coupled to said driver input and a second input for receiving said second signal and having an output coupled to said N transistor transient driver;
   a first at least one assist transistor coupled between the second input and the output of said first transient predriver controlling the switching speed of said P transistor transient driver;
   a second at least one assist transistor coupled between the second input and the output of said second transient predriver controlling the switching speed of said N transistor transient driver.

6. The circuit defined by claim 5 wherein said first transient predriver is a NAND gate and said second transient predriver is a NOR gate.

7. The circuit defined by claim 1 wherein said compensating means comprises:
   precharge means for charging a dummy load to a supply voltage during a first phase of a clock signal;
   driver means for discharging the charge on said dummy load during a second phase of said clock signal;
   predriver means for charging an input of said driver means with a feedback signal;
   level detector means coupled to said dummy load for detecting when the voltage on said dummy load falls below a predetermined voltage;
   latch means coupled to said level detector means and a first capacitor means for latching the output of said level detector means during the second phase of said clock signal and charging said first capacitor with the value of said latched output;
   transfer gate means coupled to said first capacitor means for transferring the charge on said first capacitor means to a second capacitor means, wherein the output of said transfer gate means is also said feedback signal to said predriver means.

8. The circuit defined by claim 7 wherein said precharge means comprises an N transistor and a P transistor whose gates are coupled to said clock signal.

9. The circuit defined by claim 7 wherein said driver means comprises a transistor whose gate is coupled to said predriver means and whose source is coupled to said precharge means and said dummy load and whose drain is coupled to ground.

10. The circuit defined by claim 7 wherein said predriver means comprises at least one transistor of opposite polarity to that of said driver means and having an input coupled to said clock signal and said feedback signal.

11. The circuit defined by claim 7 wherein said level detector means comprises at least one transistor whose gate is coupled to an output of said driver means.

12. The circuit defined by claim 7 wherein said latch means comprises first and second pairs of transistors, each transistor pair having two transistors of opposite polarity coupled in parallel whose gates are coupled to said clock signal, and at least one inverter coupled between said two pairs of transistors.

13. The circuit defined by claim 7 wherein said transfer gate means comprises a transistor pair having two transistors of opposite polarity coupled in parallel and whose gates are coupled to said clock signal.

* * * * *

UNITED STATES PATENT AND TRADEMARK OFFICE,
CERTIFICATE OF CORRECTION

PATENT NO. : 4,975,598
DATED : December 4, 1990
INVENTOR(S) : Shekhar Borkar

It is certified that error appears in the above-identified patent and that said Letters Patent is hereby corrected as shown below:

Col. 2   Under Table 1

Insert -- where di/dt is the rate of change of current in milli-amps/nano-sec.--

Signed and Sealed this

Twenty-fourth Day of August, 1993

*Attest:*

BRUCE LEHMAN

*Attesting Officer*   Commissioner of Patents and Trademarks